(12) United States Patent
Fujii et al.

(10) Patent No.: US 6,208,078 B1
(45) Date of Patent: Mar. 27, 2001

(54) DISPLAY DEVICE AND DISPLAY DEVICE ASSEMBLY

(75) Inventors: Takehiro Fujii; Hiroki Ishinaga, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/206,824

(22) Filed: Dec. 7, 1998

(30) Foreign Application Priority Data

Dec. 8, 1997 (JP) .................................................... 9-336852

(51) Int. Cl.$^7$ ...................................................... H01J 1/62
(52) U.S. Cl. ............................ 313/510; 313/513; 313/51; 345/82; 345/206
(58) Field of Search ........................... 313/510, 513, 313/500, 505, 51, 318.12; 438/34; 345/82, 206; 257/88, 81, 99

(56) References Cited

U.S. PATENT DOCUMENTS

| 3,246,193 | * | 4/1966 | Dickson, Jr. et al. | 313/510 |
| 4,146,883 | * | 3/1979 | Appeldorn et al. | 340/378 |
| 5,457,356 | * | 10/1995 | Parodos | 313/505 |
| 5,621,225 | * | 4/1997 | Shieh et al. | 257/81 |
| 5,780,321 | * | 7/1998 | Shieh et al. | 438/34 |

FOREIGN PATENT DOCUMENTS 09092888    4/1997  (JP) .

* cited by examiner

Primary Examiner—Ashok Patel
Assistant Examiner—Karabi Guharay
(74) Attorney, Agent, or Firm—Merchant & Gould P.C.

(57) ABSTRACT

A display device for performing a display by turning on selected ones of a plurality of light sources is disclosed. This display device comprises a substrate having an upper surface disposed with the light sources, a reflecting case mounted to the substrate and provided with a plurality of window holes each corresponding to one of the light sources, and a lower surface terminal portions each provided in a lower surface of the substrate and electrically connected to one of the light sources. The lower surface terminal portions are disposed in a region inward of outer edges of the substrate.

7 Claims, 4 Drawing Sheets

DISPLAY DEVICE AND DISPLAY DEVICE ASSEMBLY

BACKGROUND OF THE INVENTION

1. Field of the Invention

The present invention relates to a display device comprising a plurality of light sources such as LED's disposed in a predetermined pattern for displaying a symbol such as a numeral or a character by turning on selected light sources. Further, the present invention relates to a display device assembly comprising a plurality of the above display devices mounted on a mother board.

2. Background Art

Conventional display devices of the above type include a seven-segment LED display device in which seven, bar-shaped, light emitting elements are disposed in a pattern of a numeric FIG. 8 for displaying a desired numeral. Also included is an eight-segment LED display device which is a seven-segment device added with another light emitting element representing a decimal point. Further included is a dot-matrix type LED display device in which a plurality of dots each made of a light emitting element are disposed in a matrix pattern for displaying a symbol such as a numeral or a character. Each of these display devices is mounted on a mother board, and is supplied with electric power through the mother board. Conventionally, mounting of these display devices is made as follows for example.

Specifically, referring now to FIG. 4, when a display device 1 has outer edges formed with a plurality of terminals 10 each connected to one of the light sources, each of the terminals 10 is bonded to a terminal portion formed on the mother board by soldering. More specifically, each of the terminals 10 of the display device 1 or each of the terminal portions on the mother board is coated with solder in advance, and then, the display device 1 is aligned with and lowered on the mother board. Next, the solder is re-melted, and then cooled to set, completing the mounting of the display device 1 to the mother board.

Now, in order to display a plurality of numerals or characters simultaneously, a plurality of the display devices must be disposed in a line and/or row. In such a case, each of the display devices 1 should be disposed as closely to adjacent display devices as possible so that the plurality of the numerals or characters do not appear too far away from each other giving a poor look.

There is a problem, however. Specifically, when using the display device 1 in which the plurality of terminals 10 are formed along the outer edge portions, solder portions 11 stay extended out of the outer edge portions in each of the display devices 1. For this reason, as shown in FIG. 5, each display device 1 must be spaced from another by a certain distance. Since it is impossible to dispose the display devices 1 closely to each other, it is impossible to make an outer edge of one display device 1 abut on an opposing outer edge of an adjacent display device 1.

DISCLOSURE OF THE INVENTION

It is therefore an object of the present invention to provide a display device comprising a plurality of light sources for displaying a symbol such as a numeral or a character by turning on selected light sources, which can be mounted more adjacent to another.

According to a first aspect of the present invention, a display device having a following arrangement is provided.

Specifically, the display device performs a display by turning on selected ones of a plurality of light sources, and comprises a substrate having an upper surface disposed with the light sources, a reflecting case mounted to the substrate and provided with a plurality of window holes each corresponding to one of the light sources, and lower surface terminal portions each provided in a lower surface of the substrate and electrically connected to one of the light sources.

Further, the lower surface terminal portions are disposed in a region inward of outer edges of the substrate.

According to a preferred embodiment, each of the window holes of the reflecting case is filled with a transparent or translucent resin.

According to the preferred embodiment, the lower surface of the substrate is further formed with matching pins.

According to the preferred embodiment, the light sources are disposed in a matrix pattern on the substrate.

According to a second aspect of the present invention, there is provided a display device assembly comprising a plurality of the display devices of the above arrangement. The plurality of display devices are mounted closely to each other laterally and/or longitudinally on a mother board.

Other features and advantages of the present invention should become clear from descriptions to be made below with reference to the accompanying drawings.

DETAILED DESCRIPTION OF A PREFERRED EMBODIMENT

A preferred embodiment of the present invention will be described here below with reference to the accompanying drawings.

Figure 1:
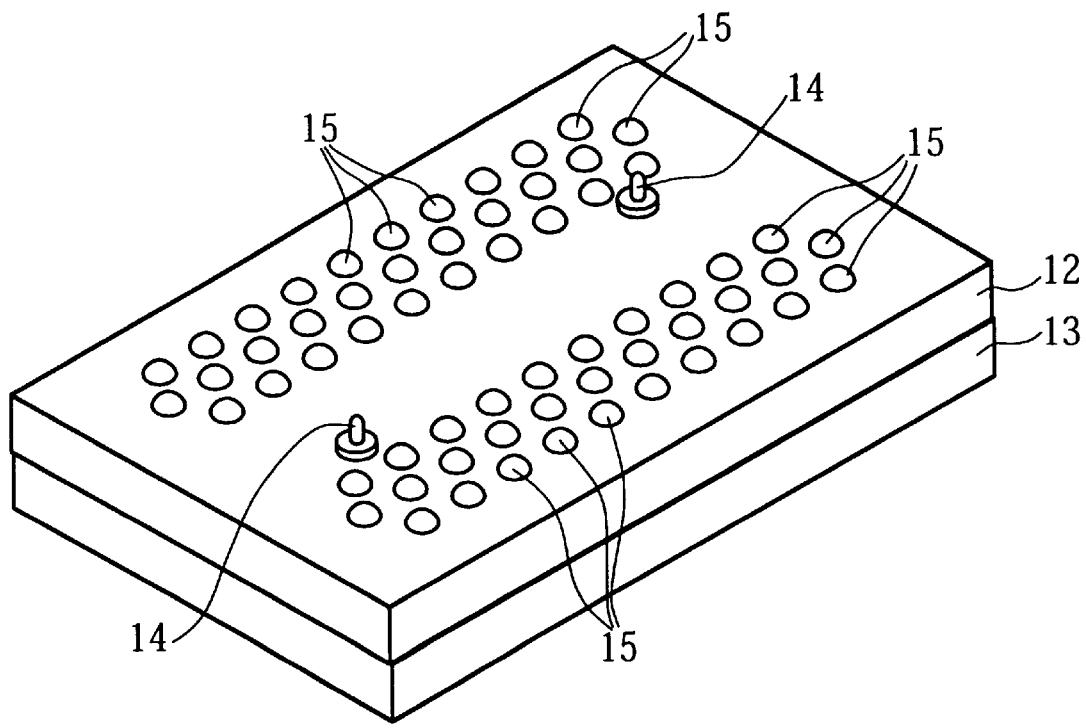
FIG. 1 is a perspective view of a lower surface of a display device according to the present invention.
Figure 2:
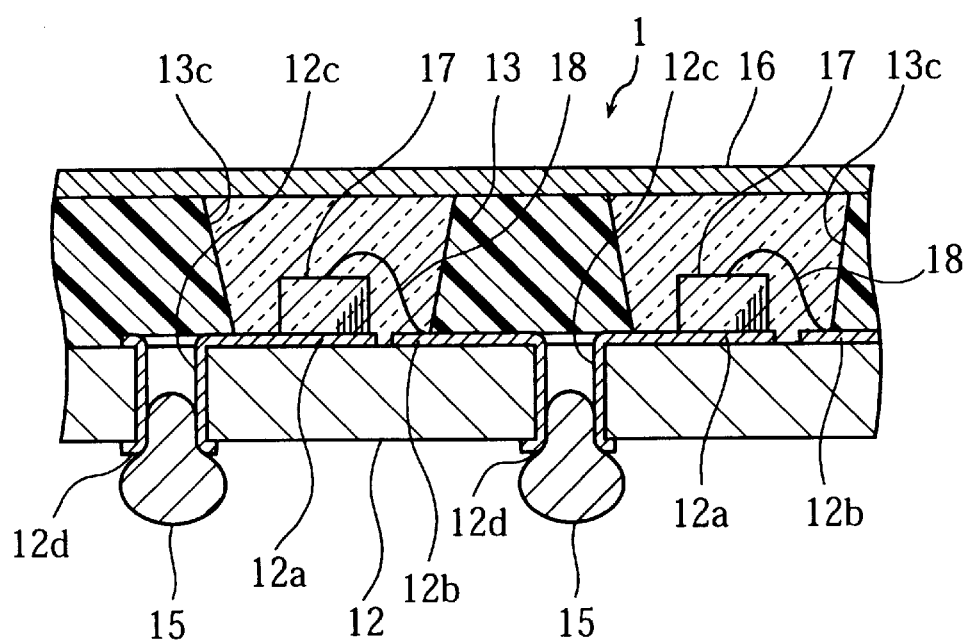
FIG. 2 is a sectional view of a primary portion of the above display device.
Figure 3:
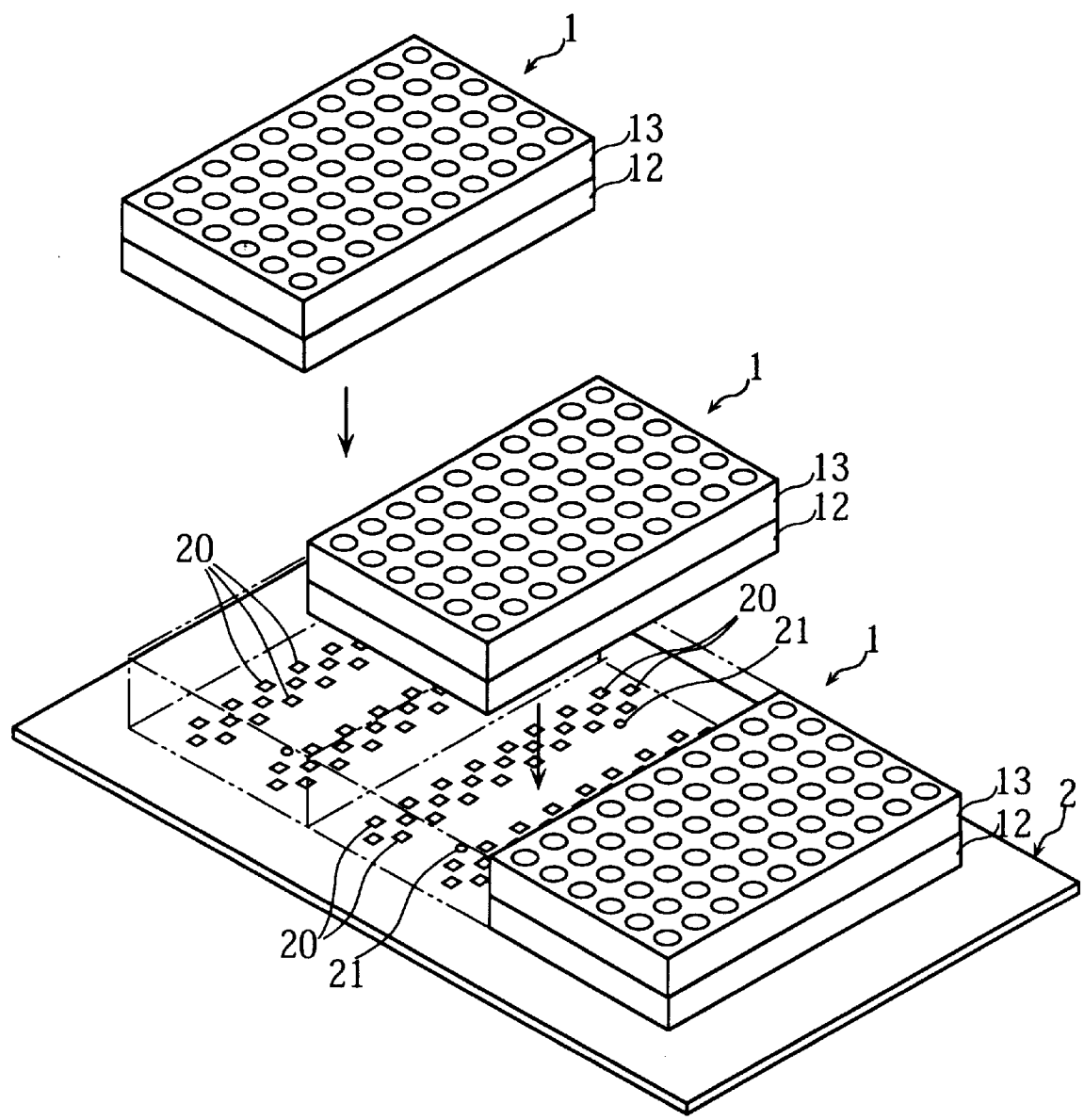
FIG. 3 is a perspective view of the display device being mounted to a mother board.
Figure 4:
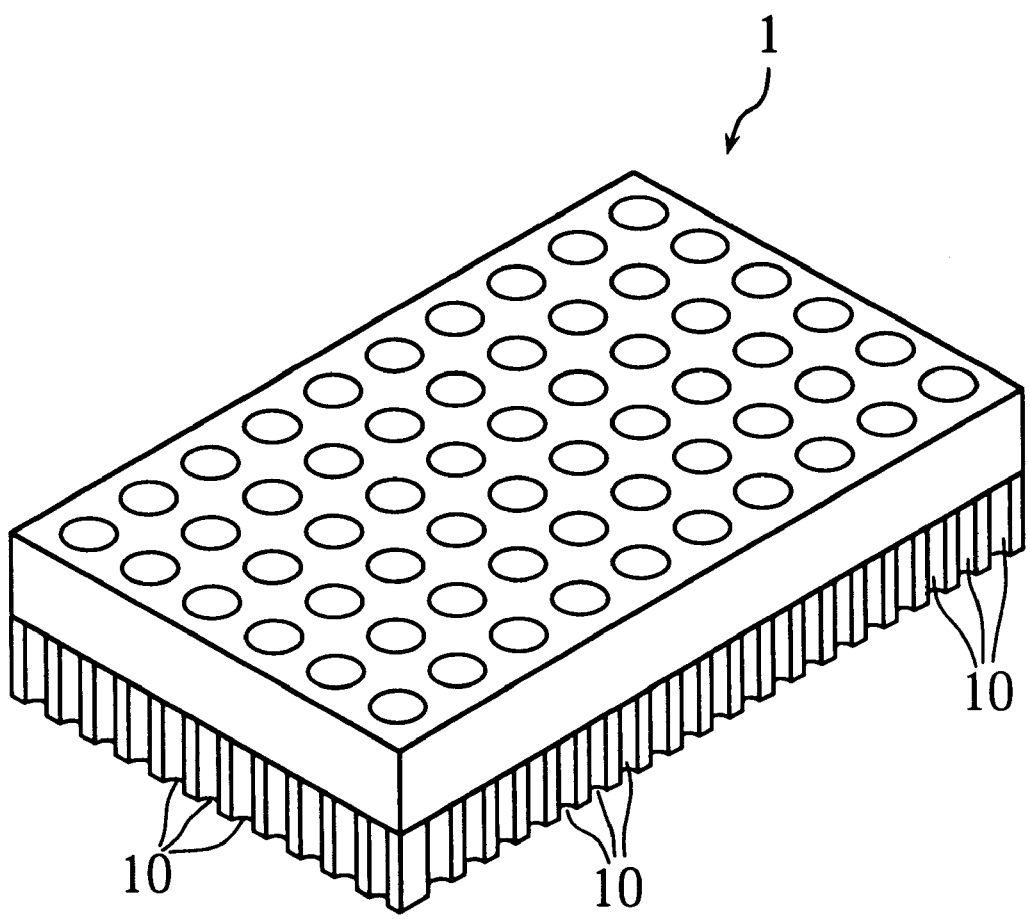
FIG. 4 is an overall perspective view of a prior art display device.
Figure 5:
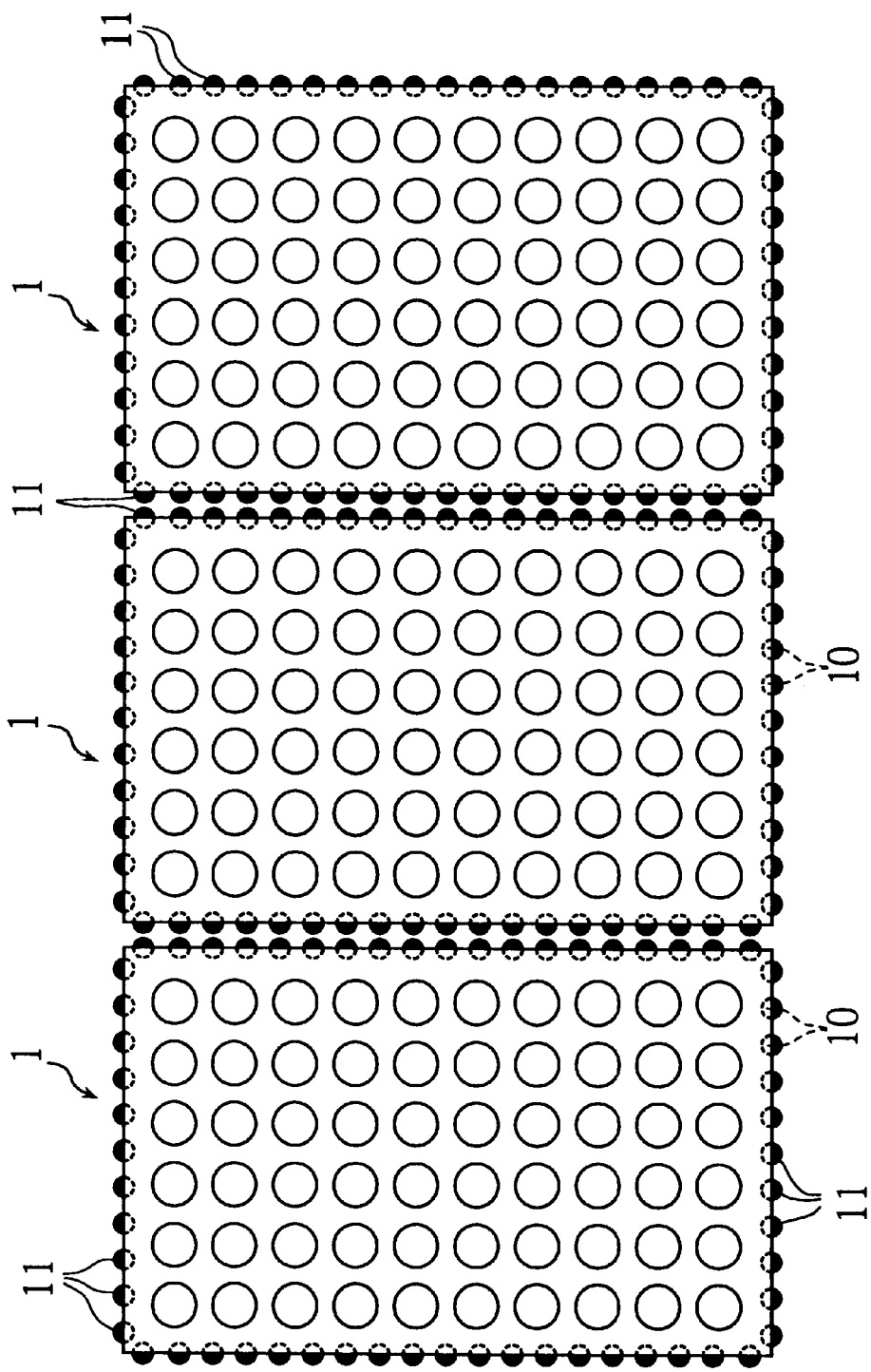
FIG. 5 is a perspective view of the prior art display device mounted to a mother board.

FIG. 1 is a perspective view of a lower surface of a display device according to the present invention. FIG. 2 is a sectional view of a primary portion of the display device, whereas FIG. 3 is a perspective view of the display device being mounted to a mother board. It should be noted here that the display device according to the present embodiment is a dot-matrix type display device.

As shown in FIGS. 1 and 2, the display device 1 generally comprises a substrate 12 including a plurality of light sources 17 disposed in a matrix pattern, and a reflecting case 13 attached to an upper surface of the substrate 12.

As clearly shown in FIGS. 1 and 2, the reflecting case 13 is formed with a plurality of window holes 13c each corresponding to a location where one of the light sources 17 is mounted. More specifically, the window holes 13c are disposed in a matrix pattern, and in order to give efficient irregular reflection to the light from the light sources 17, the reflecting case 13 is formed by a resin of a whity color for example. Further, each of the window holes 13c is filled with a transparent resin such as an epoxy resin, and an upper surface of the reflecting case 13 is coated in a dark color for a clear visibility when the light sources 17 are turned on.

Further, the upper surface of the reflecting case 13 may be provided with a half mirror 16. The half mirror 16 may be made of a transparent sheet of a synthetic resin on which a metal as aluminum, silver or chromium is vapor-deposited.

As clearly shown in FIG. 2, the upper surface of the substrate 12 is formed with the light sources 17 and a plurality of upper surface terminals 12a, 12b each connected with one of the light sources 17. The upper surface terminal 12a is provided with one of the light sources 17, and functions as an individual terminal 12a, whereas the upper surface terminal 12b is connected to said light source 17 via a wire 18, and functions as a common terminal 12b. It should be noted here that each of the upper surface terminals 12a, 12b can be made by first forming a thin film of conductive metal such as copper, and then etching the thin film.

The lower surface of the substrate 12 is formed with a plurality of lower surface terminal portions 12d each connected with one of the pairs of the upper surface terminals 12a and 12b. These lower surface terminal portions 12d are concentrated to a central region away from outer edges of the substrate 12 by a predetermined distance. As clearly shown in FIG. 2, each of the individual terminals 12a is connected with one of the lower surface terminal portions 12d formed in the lower surface of the substrate 12 via a through hole 12c. On the other hand, though not illustrated, all of the common terminals 12b are grouped into one or more grounding terminals each connected with the lower surface terminals 12d via the through holes 12c.

As clearly shown in FIGS. 1 and 2, each of the lower surface terminal portions 12d is formed with a ball-shaped solder terminal portion 15. These solder terminal portions 15 are also concentrated at the central region of the lower surface corresponding to the lower surface terminal portions 12. More specifically, the central region includes two bands of solder terminals 15, and each of the bands includes three longitudinal rows of the solder terminals 15. Further, the solder terminals 15 of one band and those of the other band are symmetrical with respect to a center point of the substrate 12. Still further, a pair of matching pins 14, 14 are disposed symmetrically to each other with respect to the center point of the substrate 12 for facilitating the assembly of the display device 1 to the mother board 2.

The display device 1 having the above arrangement is mounted and fixed to the predetermined mother board 2, and the display device is supplied with driving power via the mother board 2. Needless to say, each of the light sources 17 can be driven independently from others. As clearly seen in FIG. 3 for example, the mother board 2 is formed with a plurality of terminal portions 20 corresponding to the solder terminal portions 15. In addition, the mother board 2 is formed with a pair of mating holes 21 corresponding to the matching pins 14.

With the above arrangement, the display device 1 is mounted to the mother board 2 as follows. Specifically, the display device 1 is lowered to the mother board 2 by inserting each of the matching pins 14, 14 into the corresponding mating hole 21. In this step each of the solder terminal portions 15 is brought into contact with one of the terminal portions 20 of the mother board 2. It should be noted here that according to the present invention, the matching pins 14 as well as the solder terminal portions 15 are symmetrical with respect to the center point of the substrate 12. This arrangement is advantageous in that no special care may be taken for a bottom-top orientation of the display device 1 when lowering the display device 1.

Once the display device 1 has been lowered onto the mother board 2, then the mother board 2 is moved into a re-flow furnace for example for melting and then solidifying each of the solder terminal portions 15. This operation establishes firm electrical connection between the lower surface terminal portions 12d of the substrate 12 and the terminal portions 20 of the mother board 2.

According to the above arrangement, the display device 1 is attached to the mother board 2 by surface-mounting, with an enhanced aligning means of the matching pins 14 and the mating holes 21. Thus, the display device 1 can be lowered onto the mother board 2 accurately and easily. Further, the lower surface terminal portions 12d are concentrated to the central region of the substrate 12. Thus, even if the surface-mounting to the mother board 2 is performed by soldering, the molten solder will not flow out of the outer edges of the substrate 12. This brings about an advantage in mounting a plurality of display devices 1 to the single mother board 2. Specifically, a pair of adjacent display devices 1 can now be mounted so closely as to bring their opposing pair of outer edges almost to an abutment on each other. It should be noted that according to the present embodiment, the solder terminal portions 15 formed in the lower surface terminal portions 12d provide material solder necessary for the surface mounting. This brings about an advantage that none of the terminal portions 20 of the mother board 2 needs to be supplied with solder paste in advance.

As has been described, according to the display device 1 of the present invention, even if a plurality of display devices 1 are mounted in a line and/or a row onto the mother board 2, an adjacent pair of display devices 1 can be disposed very close to each other. Therefore, space between characters displayed by the display devices 1 can be small enough so that a number or a word displayed on the plurality of display devices 1 can look very naturally. This advantage is especially significant in the dot-matrix type display device 1 in which a single character or a numeral is often displayed using a plurality of display devices 1.

The present invention is of course not limited by the embodiment described above, and can be varied in many ways. For example, the display device can be a seven-segment display device, or an eight-segment display device.

Further, each of the lower surface terminal portions 12d formed in the lower surface of the substrate 12 must only be within a region inward of the outer edges of the substrate 12. Therefore, the lower surface terminal portions 12d may be disposed in many different ways. Further, electrical connection between the upper and lower surface terminal portions 12a, 12d may alternatively be established by means of a film-like terminal inserted from the upper side of the substrate to the lower side thereof, for example.

What is claimed is:

1. A display device for performing a display by turning on selected ones of a plurality of light sources, comprising;

a substrate having an upper surface on which the plurality of light sources are mounted, the substrate also having a lower surface and a plurality of through-holes extending between the upper surface and the lower surface, a reflecting case mounted to the upper surface of the substrate and provided with a plurality of window holes each corresponding to a respective one of the light sources, and lower terminals provided on the lower surface of the substrate and electrically connected to the light sources via the through-holes, wherein all of the lower terminals are spaced from outer edges of the substrate.

2. The display device according to claim 1, wherein each of the window holes of the reflecting case is filled with a transparent or translucent resin.

3. The display device according to claim 1, wherein the lower terminals are formed by solder balls.

4. The display device according to claim 1, wherein the lower surface of the substrate is further formed with matching pins at positions different from the lower terminals.

5. The display device according to claim 1, wherein the light sources are disposed in a matrix pattern on the substrate.

6. A display device assembly comprising a mother board, and a plurality of display devices mounted on a mother board, each of the display devices comprising:

> a substrate having an upper surface, a lower surface, and a plurality of through-holes extending between the upper surface and the lower surface,
>
> a plurality of light sources mounted on the upper surface of the substrate,
>
> a reflecting case mounted to the upper surface of the substrate and provided with a plurality of window holes each corresponding to a respective one of the light sources, and
>
> lower terminals provided on the lower surface of the substrate and electrically connected to the light sources via the through-holes,
>
> wherein all of the lower terminals are spaced from outer edges of the substrate, and
>
> wherein the plurality of display devices are mounted on the mother board in contact with each other.

7. The display device assembly according to claim 6, wherein the lower surface of the substrate of each display devices is further formed with matching pins at positions different from the lower terminals, the mother board being formed with mating holes for engagement with the matching pins.

* * * * *